(12) United States Patent
Haight et al.

(10) Patent No.: US 7,994,450 B2
(45) Date of Patent: Aug. 9, 2011

(54) DEBRIS MINIMIZATION AND IMPROVED SPATIAL RESOLUTION IN PULSED LASER ABLATION OF MATERIALS

(75) Inventors: Richard A. Haight, Mahopac, NY (US); Peter P. Longo, Hopewell Junction, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 672 days.

(21) Appl. No.: 10/041,328

(22) Filed: Jan. 7, 2002

(65) Prior Publication Data

US 2003/0127441 A1    Jul. 10, 2003

(51) Int. Cl.
*B23K 26/00* (2006.01)
(52) U.S. Cl. .......... 219/121.68; 219/121.84; 219/121.83
(58) Field of Classification Search ............. 219/121.84, 219/121.62, 121.61, 121.69, 121.68, 121.67, 219/121.6, 121.83, 121.85
See application file for complete search history.

(56) References Cited

U.S. PATENT DOCUMENTS

| | | | | | |
|---|---|---|---|---|---|
| 3,991,296 | A | * | 11/1976 | Kojima et al. ........... | 219/121.68 |
| 4,027,137 | A | * | 5/1977 | Liedtke ...................... | 219/121.7 |
| 4,190,759 | A | * | 2/1980 | Hongo et al. ............ | 219/121.68 |
| 4,766,009 | A | * | 8/1988 | Imura et al. ................... | 427/581 |
| 4,906,812 | A | * | 3/1990 | Nied et al. ................ | 219/121.63 |
| 5,043,556 | A | * | 8/1991 | Aono et al. ............... | 219/121.72 |
| 5,112,328 | A | * | 5/1992 | Taboada et al. .................... | 606/4 |
| 5,656,186 | A | * | 8/1997 | Mourou et al. ........... | 219/121.69 |
| 6,090,507 | A | | 7/2000 | Grenon et al. ...................... | 430/5 |
| 6,156,461 | A | | 12/2000 | Grenon et al. ..................... | 430/5 |
| 6,190,836 | B1 | | 2/2001 | Grenon et al. ................ | 430/311 |
| 6,262,390 | B1 | * | 7/2001 | Goland et al. ........... | 219/121.85 |
| 6,285,002 | B1 | * | 9/2001 | Ngoi et al. ............... | 219/121.73 |
| 6,333,485 | B1 | * | 12/2001 | Haight et al. ............. | 219/121.68 |
| 6,423,921 | B2 | * | 7/2002 | Beyer et al. .............. | 219/121.44 |
| 6,496,257 | B1 | * | 12/2002 | Taniguchi et al. .......... | 356/239.2 |
| 6,621,045 | B1 | * | 9/2003 | Liu et al. .................... | 219/121.7 |

OTHER PUBLICATIONS

MARS: Femtosecond laser mask advanced repair system in manufacturing; Richard Haight, Dennis Hayden, Peter Longo, Timothy Neary, Alfred Wagner; 1999; pp. 3137-3142.

* cited by examiner

*Primary Examiner* — M. Alexandra Elve
(74) *Attorney, Agent, or Firm* — Thomas A. Beck; Daniel P. Morris (57) ABSTRACT

A method and an apparatus of minimizing the deposition of debris onto a sample being ablated. The method comprising the steps of: 1) reducing a laser pulse energy to approximately a threshold level for ablation; and 2) ablating a region of the sample using a multitude of laser pulses, each pulse being sufficiently separated in time to reduce a concentration of ablation products in a gas phase. An apparatus for ablating a region of a sample with a laser beam. The apparatus comprises: 1) a source providing a pulsed laser beam of a certain energy, the source focusing the laser beam on the sample to ablate a region of the sample; and 2) a device for providing a flowing fluid over the region being ablated to remove the ablation products.

6 Claims, 9 Drawing Sheets

DEBRIS MINIMIZATION AND IMPROVED SPATIAL RESOLUTION IN PULSED LASER ABLATION OF MATERIALS

BACKGROUND OF THE INVENTION

1. Field of the Invention

The present invention relates to modifying structures by a laser, and, more particularly, to removing material from photomasks and/or integrated circuits by the use of a pulsed laser.

2. Brief Description of Related Developments

During the manufacture of photomasks and/or integrated circuits, undesirable structures or parts of structures require removal or modification. Several techniques have been used to accomplish these objects in the past.

Almost all photomasks manufactured and especially, leading edge photomasks require the correction of defects that normally form as a result of excess chromium (Cr), for example, on the underlying substrate such as quartz ($SiO_2$). The removal of such defects must not damage adjacent structures with the material removed by a laser, for example. This damage may be the result of splatter or haze created during the ablation of the material.

Several techniques have been used in the past. For example, a focused ion beam of gallium (Ga) with a halogen gas has been used. Spatial resolution of less than 25 nm has been achieved. Several disadvantages are Ga implanting as the undesired material is removed which significantly reduces the optical transmission of the underlying quartz surface. Also, the underlying quartz is almost always damaged by erosion and pitting. Another technique is the use of nanosecond pulsed laser beams to ablate the Cr, for example. The pulsed laser excites electrons whose energy is converted into phonons that subsequently heat the material. This heat may melt Cr that evaporates in a completely thermal process. As a result of thermal diffusion, the material may have balling or curling at the edges and splatters the material across the photomask surface near the ablation. The evaporated material produces a general haze, which reduces significantly the optical transmission of the quartz substrate. Also, the underlying quartz substrate is ablated and this creates an optical phase shift. Thus, thermal ablation from nanosecond pulses is not acceptable for repairing features having a size below 1 micron.

In order to avoid these problems in the past, the use of ultrashort (femtosecond) laser pulses have been used. This puts sufficient energy into the excited electrons to cause the material to turn into a plasma without the use of the thermal process. This non-thermal process does not degrade the resolution, no metal is splattered, no balling at the edges of the material, no damage to the substrate. A description of the femtosecond laser process and the photomask repair system is described in the article "MARS: Femtosecond laser photomask advanced repair system in manufacturing," by Richard Haight, et al., published in Journal of Vacuum Science Technology, B 17(6), November/December 1999, pp. 3137 to 3143.

SUMMARY OF THE INVENTION

The present invention is directed to a method and an apparatus for minimizing the deposition of debris onto a sample being ablated. In one embodiment the method includes the steps of: 1) reducing a laser pulse energy to approximately a threshold level for ablation; and 2) ablating a region of the sample using a multitude of laser pulses, each pulse being sufficiently separated in time to reduce a concentration of ablation products in a gas phase. In another embodiment an apparatus is used to ablate a region of a sample with a laser beam. The apparatus comprises: 1) a source providing a pulsed laser beam of a certain energy, the source focusing the laser beam on the sample to ablate a region of the sample; and 2) a device for providing a flowing fluid over the region being ablated to remove the ablation products.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENT(S)

Figure 1:
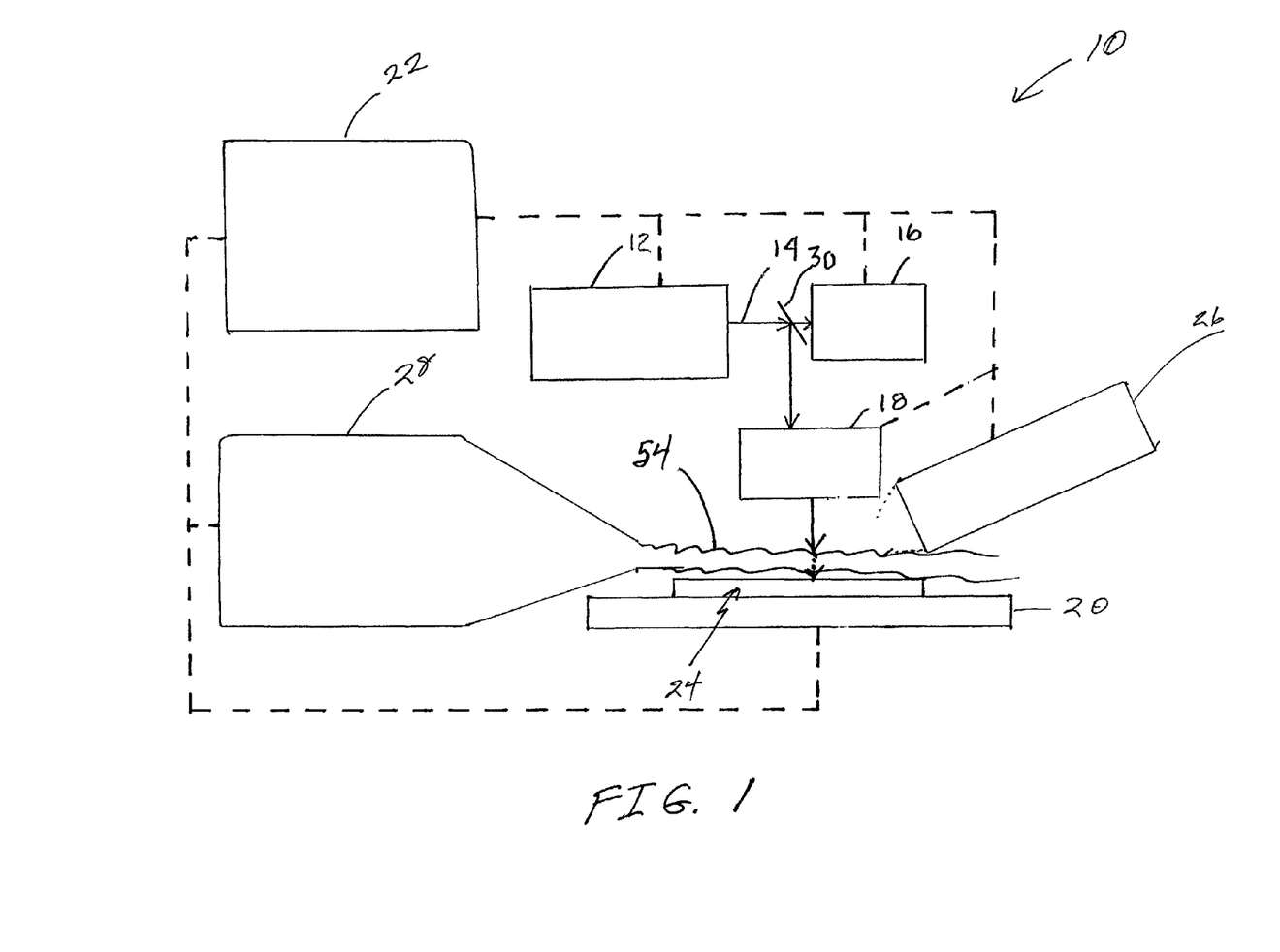
FIG. 1 is a block diagram of one embodiment of an apparatus used to remove material by laser ablation of the present invention.

Referring to FIG. 1, there is shown a laser ablation system 10 incorporating features of the present invention. Although the present invention will be described with reference to the embodiments shown in the drawings, it should be understood that the present invention can be embodied in many alternate forms of embodiments. In addition, any suitable size, shape or type of elements or materials can be used.

Figure 2:
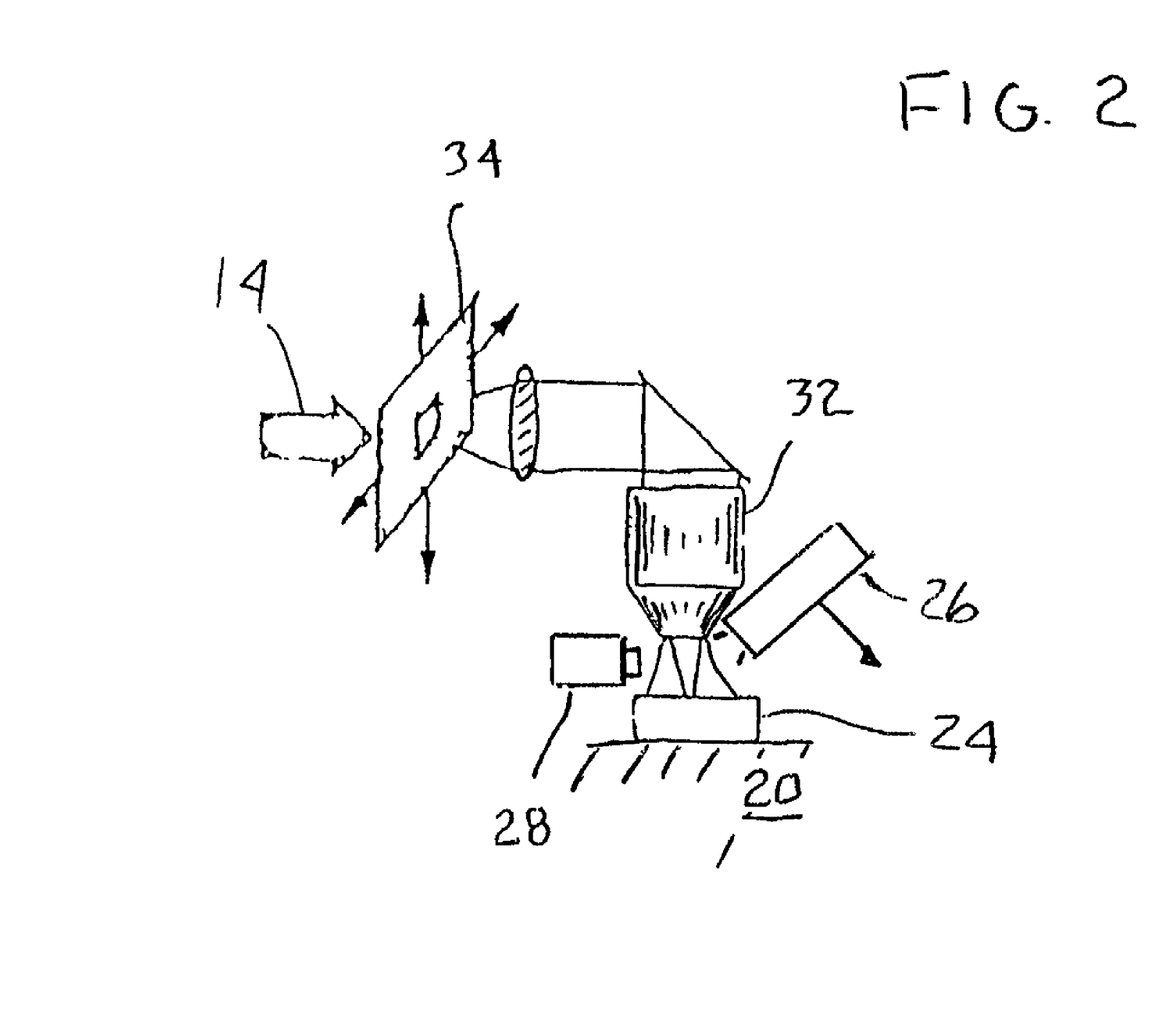
FIG. 2 is a partial view of the apparatus of FIG. 1.

As shown in FIG. 1, the laser ablation system 10 removes material from a sample 24, FIG. 2, by means a laser 12. The laser 12 outputs a laser beam 14 having an energy minimally above the threshold of ablation for the sample 24 to minimize debris formed. Further, the debris formed may also be removed by a flowing fluid 36, FIG. 3, such as a gas or a liquid, and further the flowing liquid may have the refractive index matched to a high resolution immersion objective lens material and or the material being removed to enhance spatial resolution.

Figure 3:
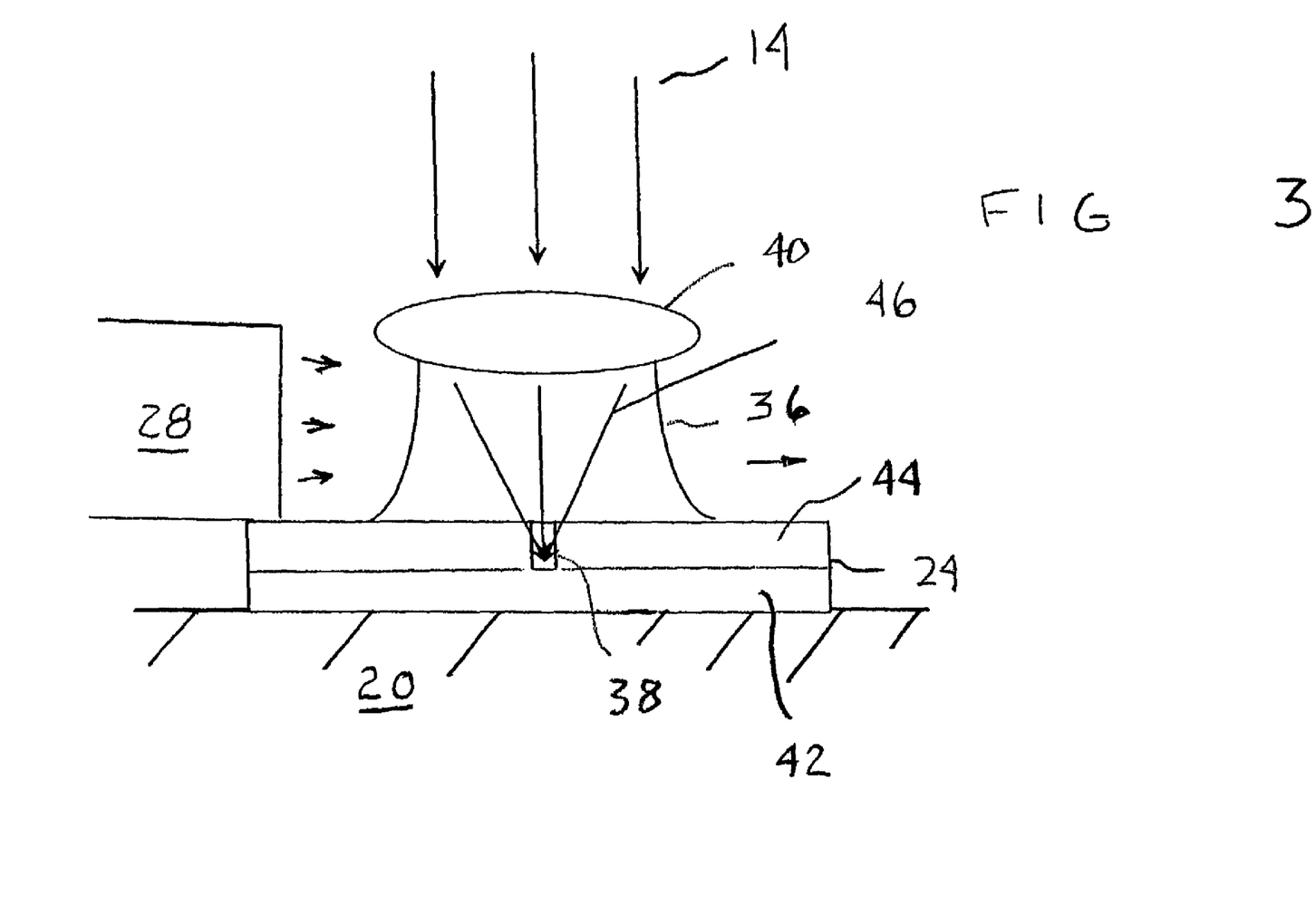
FIG. 3 is a partial view of the target, liquid and focusing lens of the apparatus of FIG. 2.

The refractive index matching fluid 36 has two uses. The first use of the refractive index matching fluid 36 is to reduce the diameter of the focused laser spot by using an immersion objective. In this case, the index of the fluid is chosen to match the index of the final element of the objective lens. This effectively increases the numerical aperture of the objective by the index of the fluid. Since the focused spot diameter is inversely proportional to the numerical aperture, this results in a smaller focused spot (yielding a spot, which is approximately 1/1.3 times smaller for typical immersion objectives). The second use of the refractive index matching fluid 36 is designed to allow a higher aspect ratio hole to be ablated by selecting a fluid 36 whose index matches the refractive index of the substrate material. For chip modification, typical substrate materials would include SiO2, SiN, polymers, SiLK (a low dielectric constant insulator for metallization).

Further as shown in FIG. 1, the laser ablation system 10 is generally used to remove a material from the sample 24, FIG. 2, by means of the laser 12 having the laser beam 14 with predetermined characteristics such as a pre-selected wavelength, duration of the pulse, and energy in the pulse that may be optimized based on the material of the sample 24. The laser 12 may output a pulsed beam 14 that is focused, FIG. 3, onto the material to be removed. Preferably, the beam is focused to a spot having a diameter less than a structure to be removed and the laser pulse is ultrashort. The spatial resolution of the ultrashort pulsed laser is limited only by the diffraction effects of the focused laser beam. This provides a significant improvement to accurately repair defects, remove defects in dense geometries, and extend repair to future high-resolution photomasks. To further aid in the removal of the ablated material, a source 28 of flowing fluid 36 such as a gas or a liquid is positioned near the sample. Preferably, the source provides a flowing liquid, which may be refractive index, matched to the objective lens material and/or the material being removed.

In greater detail, FIG. 1 shows the laser ablation system 10 generally comprising an ultrashort pulsed laser 12 being a nanosecond or femtosecond pulse, and, preferably a femtosecond pulse. This pulsed laser 12 outputs the desired beam 14 with a portion of the beam 14 entering a beam diagnostic device 16. The remaining portion of the beam 14 is operated upon by a beam control device 18 which appropriately manipulates the laser beam 14 to impinge on the sample 24 mounted on a target platform 20 which, preferably, may be a computer controlled stage. If the debris remaining after each pulse is a problem, creating small particles that remain on the sample or creating a haze over the sample, a fluid source 28 may be included in the laser ablation system 10 and is positioned near the sample surface to provide a fluid flow across the sample 24. This fluid may be either a gas or a liquid and preferably a liquid that is refractive index matched to the sample for reducing diffractive effects as the laser beam 14 interacts with high aspect structures on the sample. A camera 26 such as a CCD camera can monitor a region of the sample being removed. Each of the above devices can communicate with a controller 22 having a computer, which is programmed to control the devices and monitor the process of the present invention. An operator of the system would monitor the progress of the removal by viewing an image provided by the CCD camera 26 and would stop the process when the material is removed.

In the normal ablation process of the present invention, it is preferred that the material ablated by the pulsed laser beam 14 be from a photomask or an integrated circuit (IC) device. On a photomask, for example, the material of concern is chromium and the chromium is deposited on a substrate of glass such as silicon dioxide to provide a circuit structure that is used in making chips. During the manufacturing of the photomask, chromium defects occur with regular frequency and require removal from the photomask to be useable in making devices of concern. If the chromium is ablated by a thermal process, the chromium may then condense in the region above the ablated spot and then falls as debris onto the glass or other adjacent areas. This material is detrimental to the photomask or the IC device since it affects the finished product. The removal of material from certain features may be limited due to optical diffraction effects when the feature has a high aspect ratio such as a hole, channel or the like. The removal of the ablated products is thus critical to producing a high quality product.

It has been determined that debris formation is minimized by reducing the laser pulse energy to a value just above the threshold for ablation of the desired material as well as using a pulsed laser to control the delivery of the laser pulse energy. This has been found to reduce significantly the amount of material ablated in each laser pulse, which normally appears as a puff. There is clearly an optimum operating energy range: a high energy pulse will create a large puff and significant debris but a low energy pulse will minimize the puff but the amount of ablated material will be insignificant thus increasing the time for the removal of any structure. Factors to be considered when ablating material are the material to be removed, the laser wavelength, the energy per laser pulse, the number of pulses over a period of time, and the threshold of ablation for the material.

As noted above and in greater detail as shown in FIG. 2, the sample 24 is placed on the sample platform 20. The sample platform 20 is a conventional computer controlled stage. The ultrashort pulsed laser beam 14 is focused onto the region to be removed by an imaged aperture approach for the ablation process. This uses a variable sized rectangular aperture 34 to create an image that is focused on the sample 24, such as a photomask, through the microscope objective 32. Also shown is the camera 26 and the source 28 of fluid.

Alternatively, the laser beam can be focused to a gaussian spot and scanned over the sample in the desired pattern.

FIG. 3 illustrates the source 28 of fluid providing a flow of liquid 36, such as methanol, over the sample 24 positioned on the sample platform 20 and under the focusing lens 40. By selecting the liquid 36 to have a refractive index that closely matches the refractive index of the final element of the objective lens, i.e. by using an immersion objective, the laser beam can be focused to a smaller spot diameter thus increasing the spatial resolution of the ablation process. By selecting the liquid 36 to have a refractive index that closely matches the substrate 42 material such as $SiO_2$, or other material of a structure 44, the focused beam 46 may ablate high aspect features such as a hole 38, a channel, or the like in the structure 44 since the focused beam 46 is not diffracted at the edges when the liquid 36 also fills the hole 38.

Figure 9:
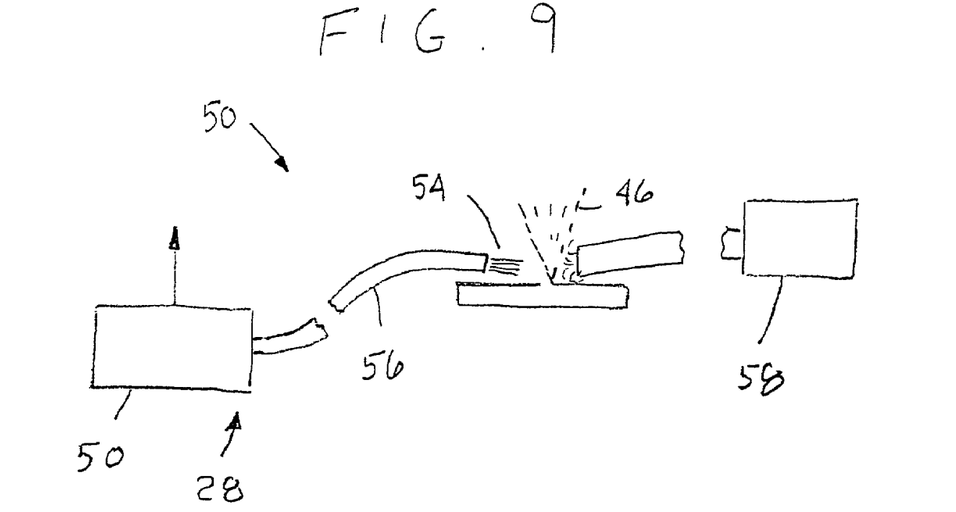
FIG. 9 is a partial block diagram of one embodiment of an apparatus incorporating features of the present invention for removing ablated material by a flowing gas.

In further detail of the source 28 of fluid, FIG. 9 illustrates a source 50 of gas providing a flow of gas 54 by means of a tube 56 near the focused laser beam 46. Although the flowing gas 54 would remove the ablated products, a vacuum apparatus 60 would further assist in sucking up the gas 54 with ablated products therein to prevent heavier particles, for example, from falling back onto the photomask at locations away from the focused laser 46. Although many types of gases may be used, the results of using helium and air are to be shown hereinbelow.

Figure 10:
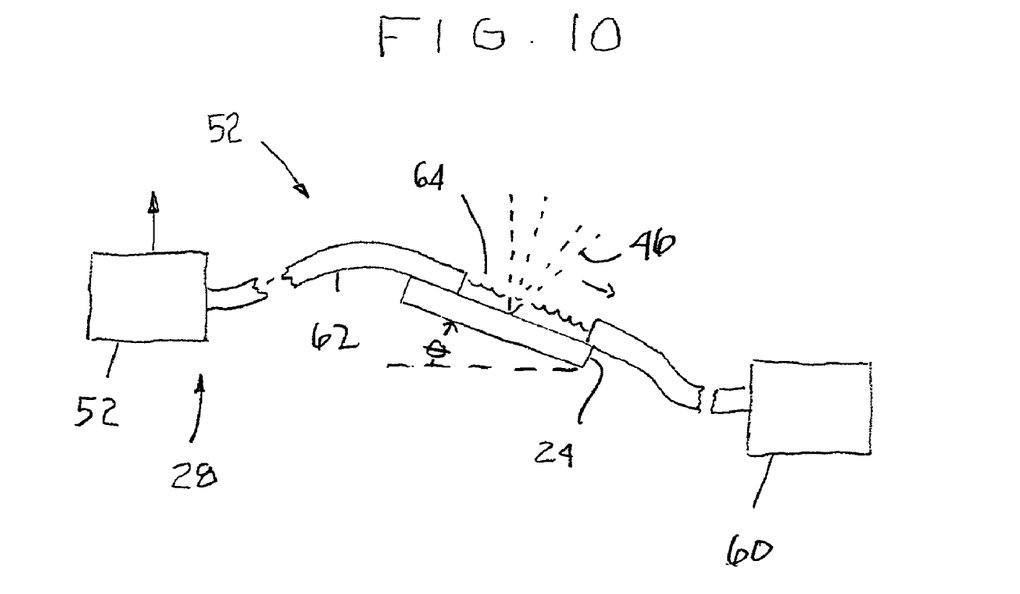
FIG. 10 is a partial block diagram of one embodiment of an apparatus incorporating features of the present invention for removing ablated material by a flowing liquid.

In another embodiment of the source 28 of fluid, FIG. 10 illustrates a source 52 of a liquid. The source 52 of a liquid provides a flow of liquid 64 by means of a tube 62 near the focused laser beam 46. Although the flowing liquid 64 would remove the ablated products, a suction apparatus 60 would further assist in sucking up the liquid 64 with ablated products therein to prevent heavier particles, for example, from settling back onto the photomask at locations away from the focused laser beam 46. The flow of the liquid 64 may be caused by a pressurized source 52 and/or by tilting the sample 24 at an angle $\Theta$. Although many types of liquids may be used, the results of using methanol and water are to be shown hereinbelow. Also, a liquid 64 having a refractive index closely matching that of the material to be removed provides a greater ability to remove material from high aspect regions such as holes.

In greater detail, system 10 of FIG. 1 has been adapted to remove Cr from a glass layer of a photomask, for example, and uses a femtosecond pulsed laser 12 outputting the beam 14 of a duration of about 100 fs, a wavelength of about 800 nm and an energy in the nanojoule range. The beam diagnostic device 16 samples a portion of the laser beam 14 by means of a partially reflecting mirror 30. The beam control device 18 appropriately manipulates the laser beam 14 to impinge on the sample 24 mounted on the sample platform 20 that is positioned under a microscope objective 32 using an interferometrically controlled stage. The target image is monitored by the charged coupled device camera 26 and the image is seen by the user at the controller 22 which features a video monitor. A user operates the controller 22 through a, for example, Windows '95 (™ of Microsoft) compliant graphical user interface. Inspection data derived defect coordinates can be delivered directly via the computer control to the sample platform 20 to drive the stage so that the desired defect appears under the focused beam.

Figure 4:
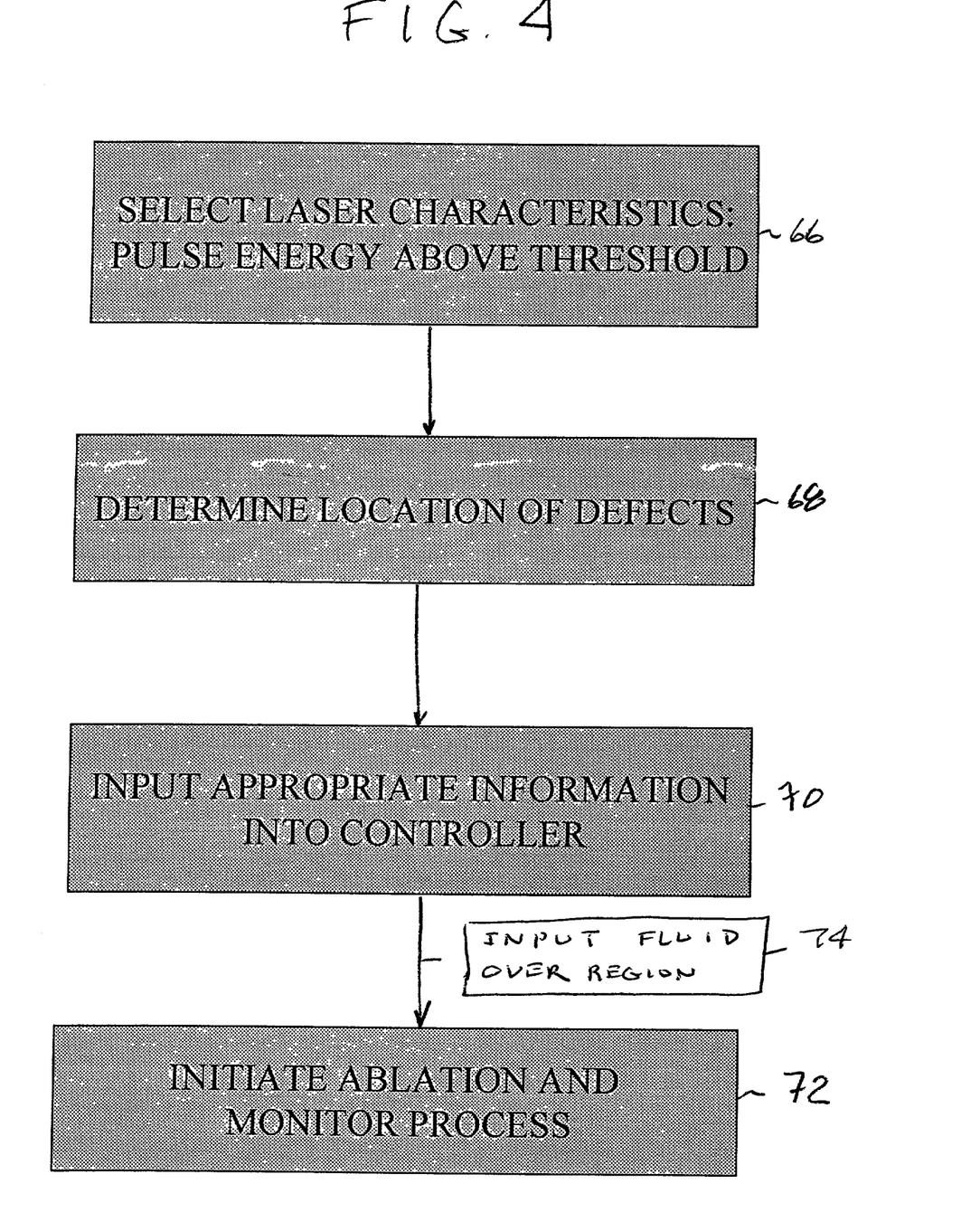
FIG. 4 is a flow chart of one embodiment of a method incorporating features of the present invention.

FIG. 4 is a flow chart of one embodiment of a method of the present invention. Based on the material to be ablated such as Cr, the appropriate laser characteristics are selected such as wavelength, duration of pulse, and the energy of the pulse so that the energy delivered is minimally above the threshold of ablation as partially shown in step 66. The location of the defect(s) to be removed is determined by optical means as noted in step 68. This and other information is input, step 70, into the controller 22 after which the laser ablation is initiated and the progress is monitored by the camera 26 by step 72. An additional step 74 may be included in the method where the fluid is provided over the region to be ablated.

The following examples of the quality of the laser ablation by the method of the present invention are only illustrative, and other gases, liquids, and materials may be ablated.

Figure 5:
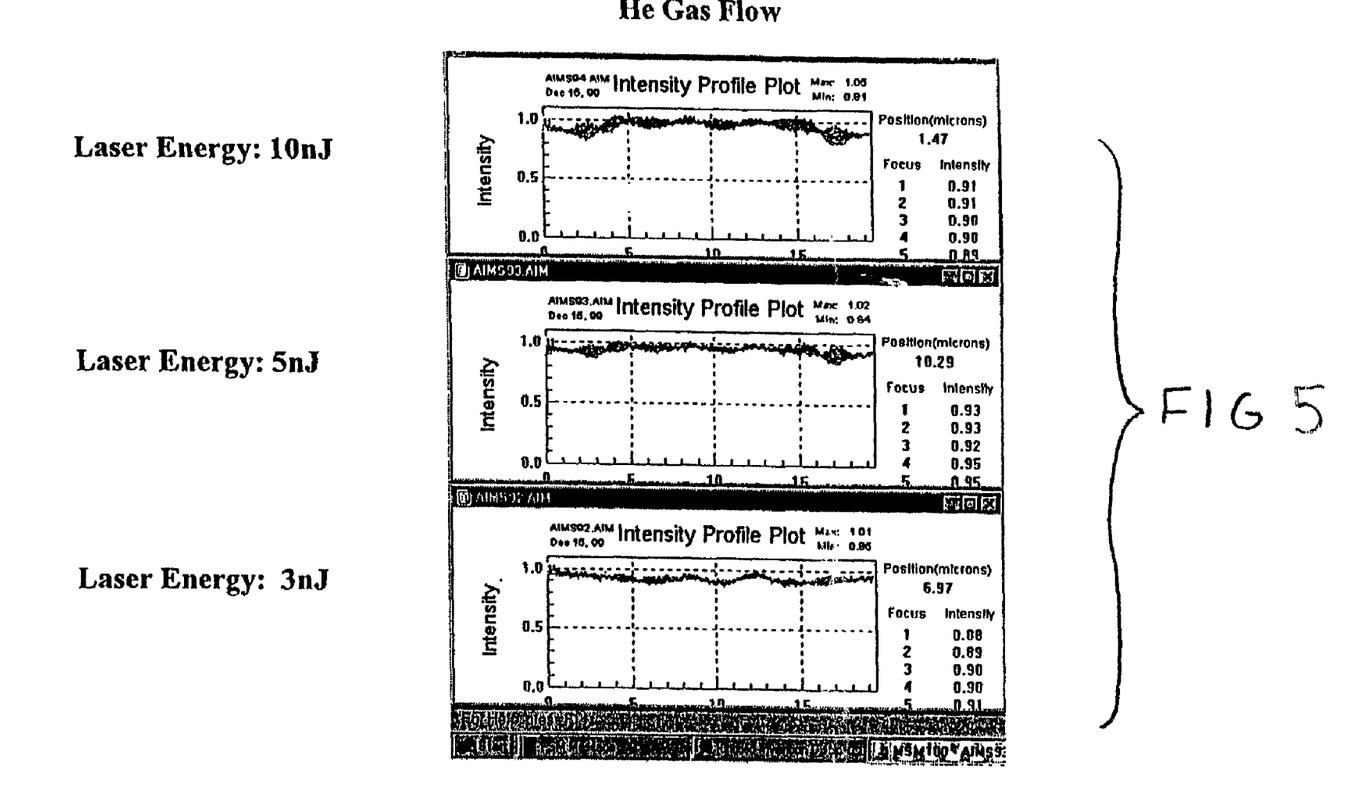
FIG. 5 is a sequence of intensity profiles at different laser pulse energies with He gas flowing over the photomask.

FIG. 5 shows the optical transmission, which is a measure of the quality of the removal of the debris near the target area on a photomask. The material being removed is Cr on glass. FIG. 5 illustrates the use helium gas flowing across the sample area or region at three different energy pulses. The optical transmission reflects the degree of debris deposited near the target area. From the graphs, it is seen that the optimum energy is about 5 nJ (nano-joules). At greater energies, i.e., 10 nJ, more debris is deposited due to the larger ablation puffs. At smaller energies, i.e., 5 nJ, the laser pulse is not sufficient to ablate the material in a sufficient time to be practical.

Figure 6:
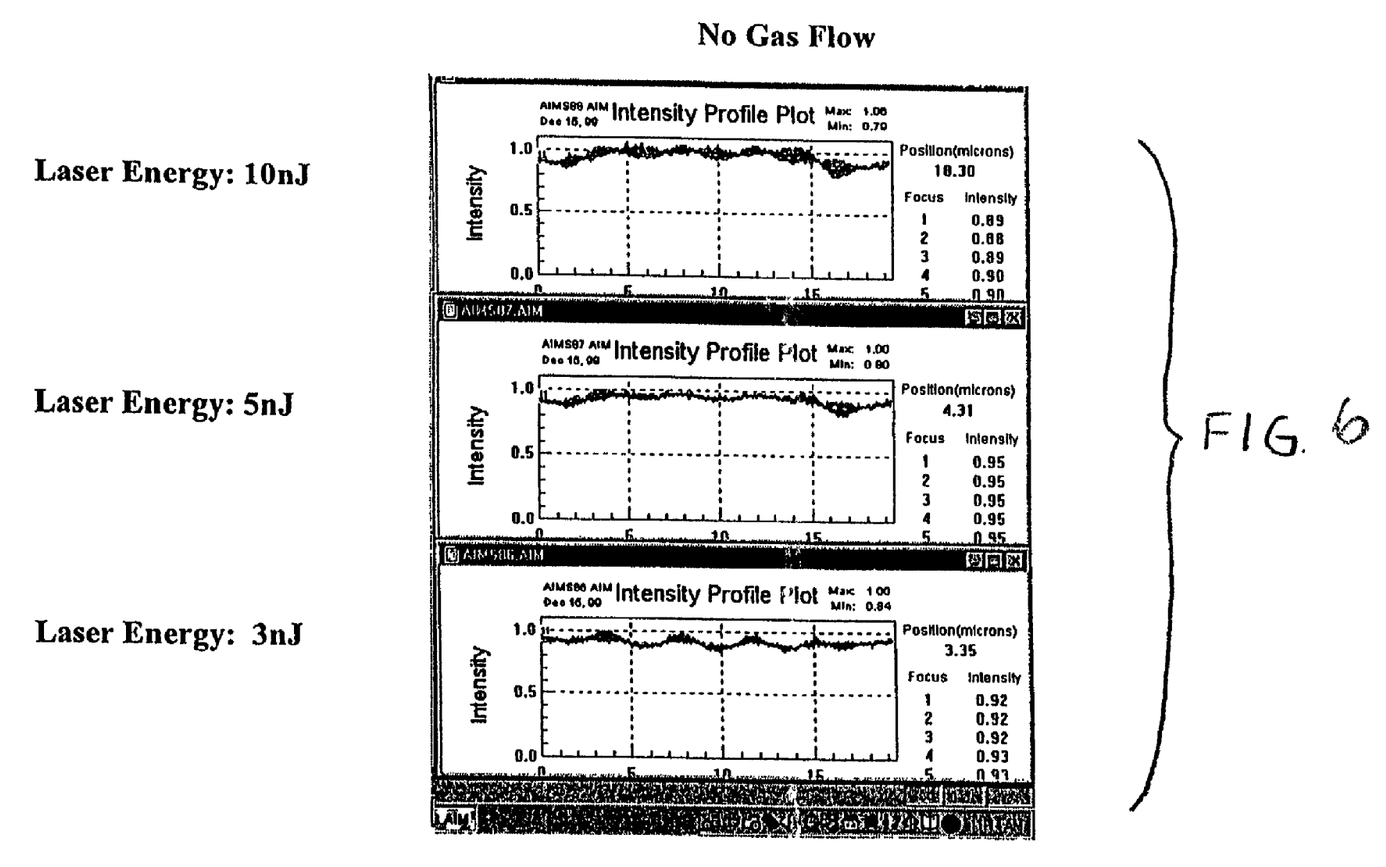
FIG. 6 is a sequence of intensity profiles at different laser pulse energies with no gas flowing over the photomask.

FIG. 6 reflects by graph the optical transmission at the different energy levels when there is no flowing gas. At each energy, it is seen that the transmission intensity is improved from the situation when no gas is flowing to helium flowing.

Figure 7:
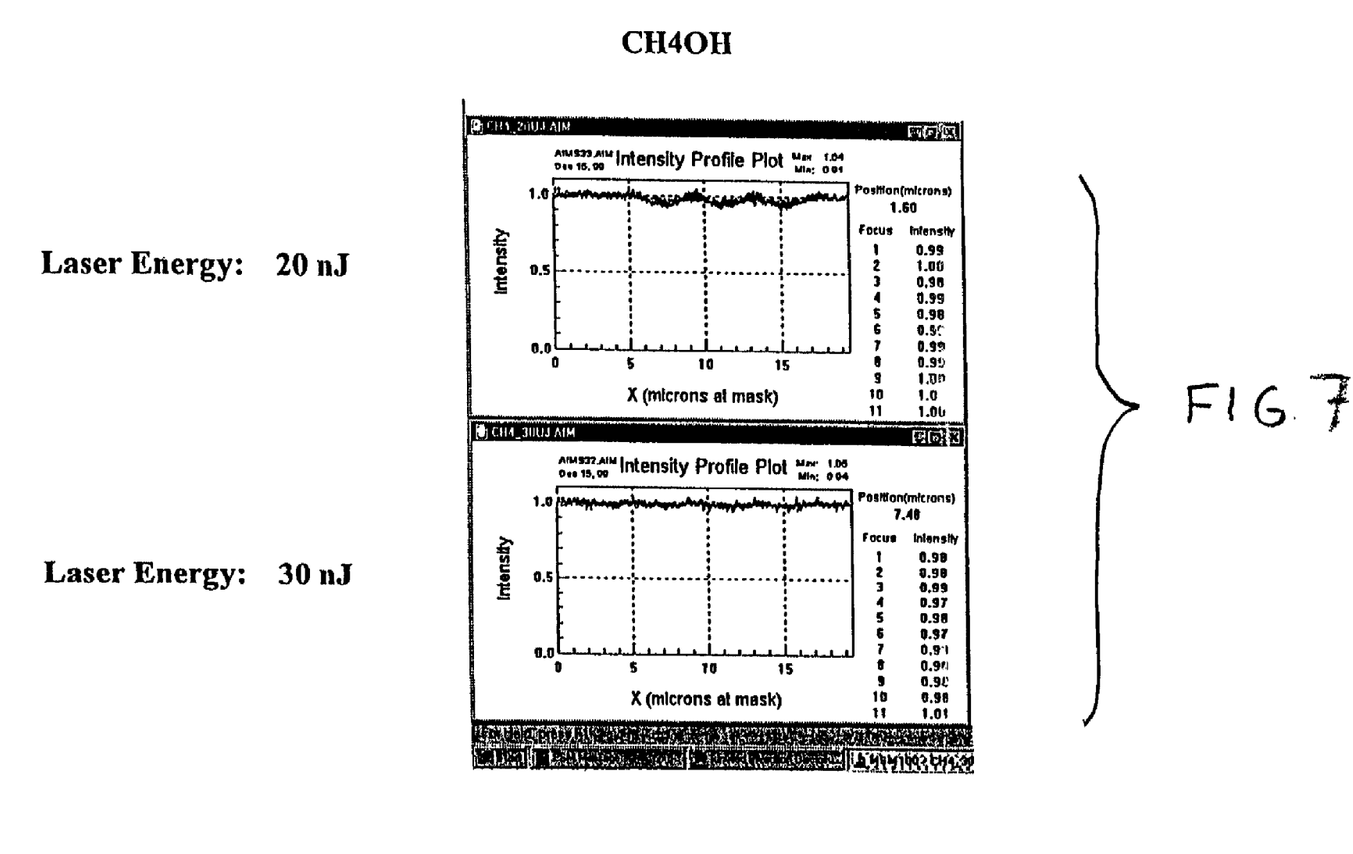
FIG. 7 is a sequence of intensity profiles at different laser pulse energies with methanol flowing between the focusing lens and the photomask.
Figure 8:
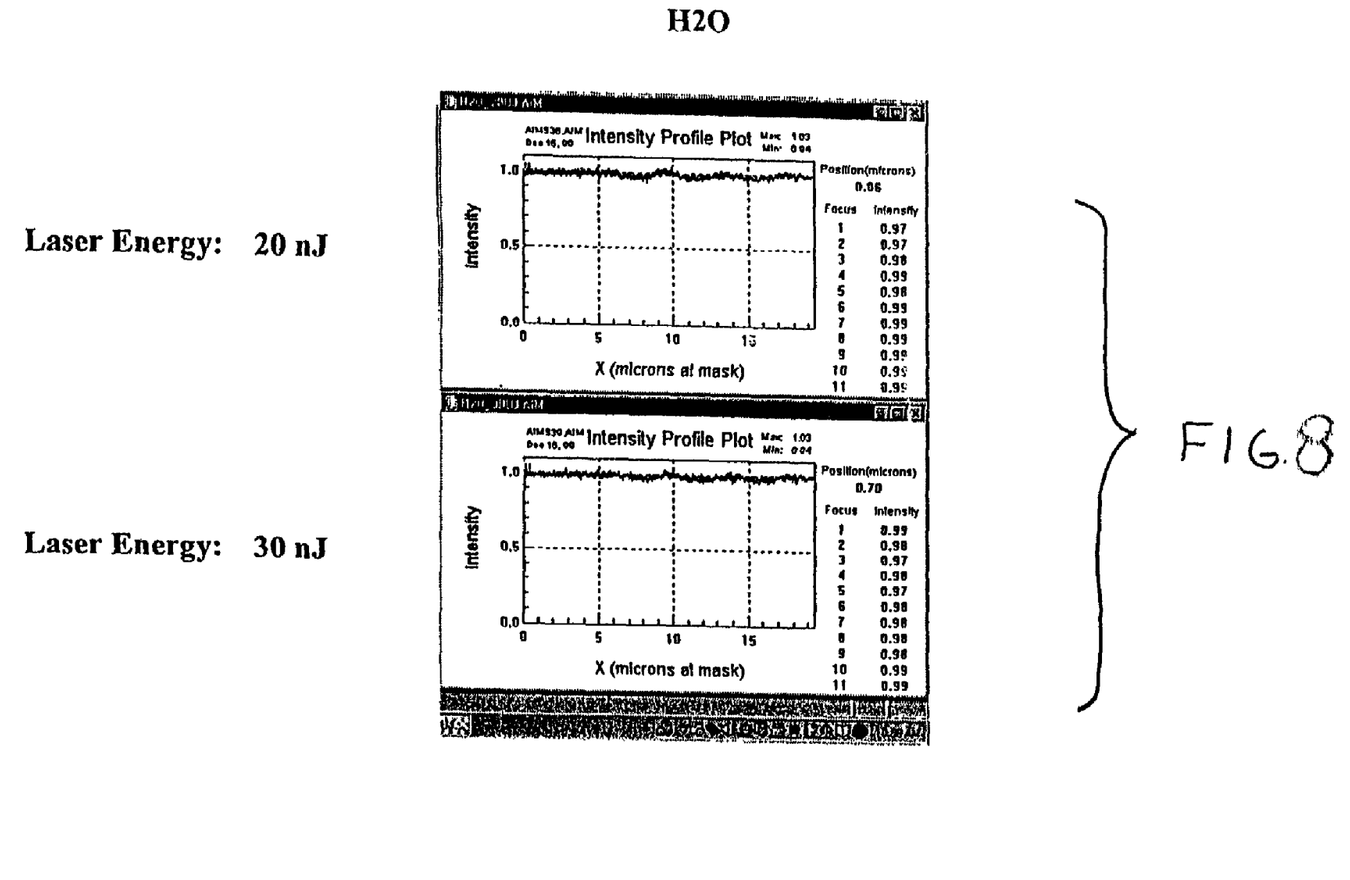
FIG. 8 is a sequence of intensity profiles at different laser pulse energies with water flowing between the focusing lens and the photomask.

FIGS. 7 and 8 further show by graph the optical transmission of a photomask in the region surrounding the target area being ablated when a liquid is used for the fluid.

FIG. 7 uses a flowing fluid of methanol and FIG. 8 uses a flowing fluid of water. As seen therein, almost a perfect optical transmission value, i.e., one, is obtained with a pulsed laser energy of 30 nJ in either liquid. The use of liquid in removing ablated products results in a superior quality photomask as seen by comparing FIGS. 5 and 6 to FIGS. 7 and 8, and would similarly improve laser ablation of other materials.

In summary, the laser ablation system 10 is used to remove a material such as chromium from the sample 24 such as a photomask by means of the laser 12 having an ultrashort pulsed laser beam 14. In order to minimize debris, the laser pulse energy is selected to be minimally above the threshold of ablation of the material. This optimizes the amount of material ablated and minimizes the amount of debris created. To aid in the removal of the ablated material, the source 28 of flowing fluid 36 such as a gas or a liquid is positioned over the region to be ablated to further remove the debris formed. Preferably, the source provides a flowing liquid and one which is refractive index matched to the objective lens and/or the material being removed so that high resolution, high aspect structures may be removed and/or altered.

It should be understood that he foregoing description is only illustrative of the invention. Various alternatives and modifications can be devised by those skilled in the art without departing from the invention. Accordingly, the present invention is intended to embrace all such alternatives and variances which fall within the scope of the appended claims.

What is claimed is:

1. An apparatus comprising:
  a combination of elements operating in combination for ablating an undesirable material from a sample, said sample being selected from the group consisting of a photomask or an integrated circuit, said elements comprising:
  a laser source element that outputs an ultrashort laser beam selected from nanosecond pulse and femtosecond pulse, said output of said beam being of a duration of about 100 fs, a wavelength of about 800 nm and energy in the nanojoule range, the energy level in said range being minimally above the threshold of ablation for said sample,
  a beam diagnostic element, in line with and adjacent to said laser, and a partially deflecting mirror, said partially deflecting mirror being positioned between, in line with and adjacent to said laser and said beam diagnostic element, said beam diagnostic element samples a first portion of said laser beam by means of said partially deflecting mirror;
  a focusing lens which appropriately manipulates and focuses a second portion of said laser beam which is deflected to it by said partially deflecting mirror;
  a computer controlled platform stage element which is interferometrically controlled suitable for supporting said sample situated thereon, said microscope beam control lens element directing said laser beam from said laser source element to impinge onto a spot on said sample mounted on said computer controlled platform element;
  a source containing a fluid, said source containing said fluid being positioned substantially horizontally adjacent and in linear alignment with said spot on said sample mounted on said computer controlled platform element;
  means for flowing said fluid over said spot being ablated simultaneously with ablation to remove ablation products, said fluid being in contact with said microscope beam control focusing lens, the surface of said sample on said controlled platform stage element;
  wherein the index of refraction of said fluid substantially matches the index of refraction of said microscope beam control lens element and that of the sample;
  a camera positioned adjacent to and in line with said sample being ablated, which monitors the region of said sample being removed, which transmits images of said sample being ablated to a video monitor at a controller for inspection of the surface of said sample, said controller having a computer which is programmed to control devices and monitor the ablation process;

said computer delivers inspection data derived defect coordinates to said sample platform so that the desired defect appears under the focused lens for ablation treatment.

2. The apparatus defined in claim 1 wherein said sample is a photomask.

3. The apparatus defined in claim 2 wherein said photomask comprises chromium on glass.

4. The apparatus defined in claim 1 wherein said fluid is a liquid.

5. The apparatus defined in claim 4 wherein said liquid is methanol.

6. An apparatus comprising:
- a combination of elements operating in combination for ablating an undesirable material from a sample, said sample being selected from the group consisting of a photomask or an integrated circuit, said elements comprising:
- a laser source element that outputs an ultrashort laser beam selected from nanosecond pulse and femtosecond pulse, said output of said beam being of a duration of about 100 fs, a wavelength of about 800 nm and energy in the nanojoule range, the energy level in said range being minimally above the threshold of ablation for said sample,
- a beam diagnostic element, in line with and adjacent to said laser, and a partially deflecting mirror, said partially deflecting mirror being positioned between, in line with and adjacent to said laser and said beam diagnostic element, said beam diagnostic element samples a first portion of said laser beam by means of said partially deflecting mirror;
- a focusing lens which appropriately manipulates and focuses a second portion of said laser beam which is deflected to it by said partially deflecting mirror;
- a computer controlled platform stage element which is interferometrically controlled suitable for supporting said sample situated thereon, said microscope beam control lens element directing said laser beam from said laser source element to impinge onto a spot on said sample mounted on said computer controlled platform element;
- a source containing a gas, said source containing said gas being positioned substantially horizontally adjacent and in linear alignment with said spot on said sample mounted on said computer controlled platform element;
- means for flowing said gas over said spot being ablated simultaneously with ablation to remove ablation products, said gas being in contact with said microscope beam control focusing lens, the surface of said sample on said controlled platform stage element;
- wherein the index of refraction of said gas substantially matches the index of refraction of said microscope beam control lens element and that of the sample;
- a camera positioned adjacent to and in line with said sample being ablated, which monitors the region of said sample being removed, which transmits images of said sample being ablated to a video monitor at a controller for inspection of the surface of said sample, said controller having a computer which is programmed to control devices and monitor the ablation process;
- said computer delivers inspection data derived defect coordinates to said sample platform so that the desired defect appears under the focused lens for ablation treatment.

* * * * *